United States Patent [19]

Marable

[11] Patent Number: 4,810,971

[45] Date of Patent: Mar. 7, 1989

[54] APPARATUS FOR DIELECTRIC TESTING OF GLOVES

[76] Inventor: Emmitte F. Marable, P.O. Box 96, Bishop, Ga. 30621

[21] Appl. No.: 105,931

[22] Filed: Oct. 8, 1987

[51] Int. Cl.$^4$ ............................................. G01R 31/16
[52] U.S. Cl. ................... 324/557; 324/514; 324/558
[58] Field of Search .................. 73/40–45.7; 324/557, 558, 559, 514

[56] References Cited

U.S. PATENT DOCUMENTS

| | | |
|---|---|---|
| 2,622,129 | 12/1952 | Killian . |
| 2,981,886 | 4/1961 | Beck . |
| 3,414,808 | 12/1968 | Thomas . |
| 3,417,327 | 12/1968 | Breidenbach ................ 324/557 |
| 4,558,273 | 12/1985 | Nishimura ..................... 324/558 |
| 4,583,039 | 4/1986 | Kolcio et al. . |

FOREIGN PATENT DOCUMENTS 2559113  7/1977  Fed. Rep. of Germany ...... 324/557
0204469 12/1982  Japan ................................ 324/557

Primary Examiner—Reinhard J. Eisenzopf
Assistant Examiner—Jose M. Solis
Attorney, Agent, or Firm—David H. Semmes

[57] ABSTRACT

Dielectric testing of rubber or plastic gloves, particularly an apparatus for suspending a plurality of pairs of water-filled gloves, then immersing the gloves into a water test tank. A high voltage test circuit includes a source of electrical power connected to the water test tank and a plurality of individual electrodes extending into each water-filled glove. Individual test circuits for each electrode enable continued testing, notwithstanding failure or removal of any one glove.

9 Claims, 5 Drawing Sheets

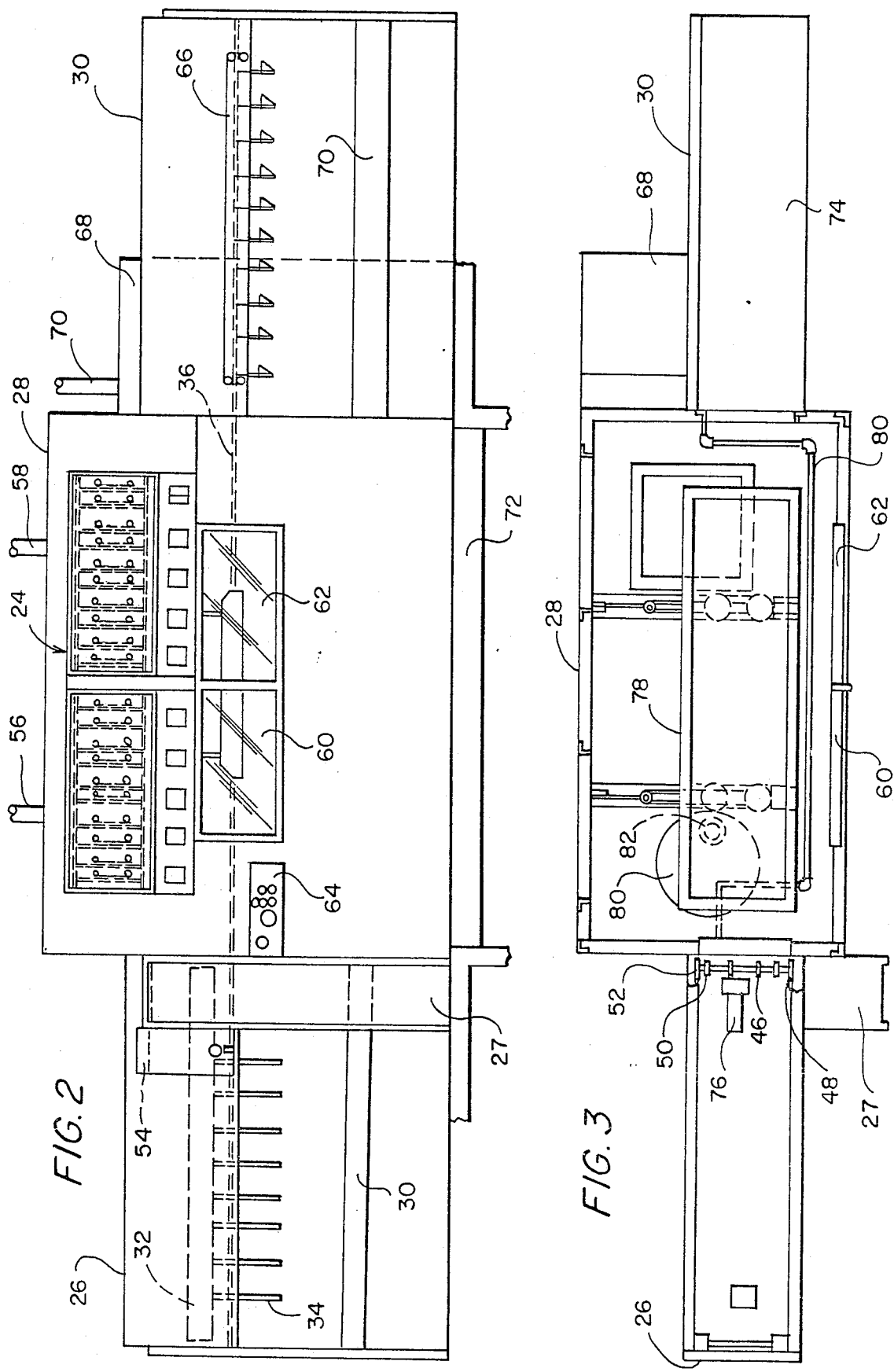

even number 4,810,971

APPARATUS FOR DIELECTRIC TESTING OF GLOVES

BACKGROUND OF THE INVENTION (1) Field of the Invention

Glove testing, particularly apparatus for testing the insulative integrity of rubber or flexible electrical worker's gloves by performing a dielectric test. The apparatus is characterized by its capability of continuing dielectric tests, notwithstanding the failure of one or more of the gloves being tested. Unpressurized water is used to fill the glove.

(2) Description of the Prior Art

Killian U.S. Pat. No. 2,622,129
Beck U.S. Pat. No. 2,981,886
Thomas U.S. Pat. No. 3,414,808
Kolcio et al. U.S. Pat. No. 4,583,039

The aforelisted references are being discussed in an accompanying INFORMATION DISCLOSURE STATEMENT.

DESCRIPTION OF THE DRAWINGS

FIG. 2 is a front elevation of a testing housing including a glove filling station, a glove testing station and a glove unloading station.

FIG. 3 is a top plan of the testing housing.

DESCRIPTION OF THE PREFERRED EMBODIMENTS

Figure 1:
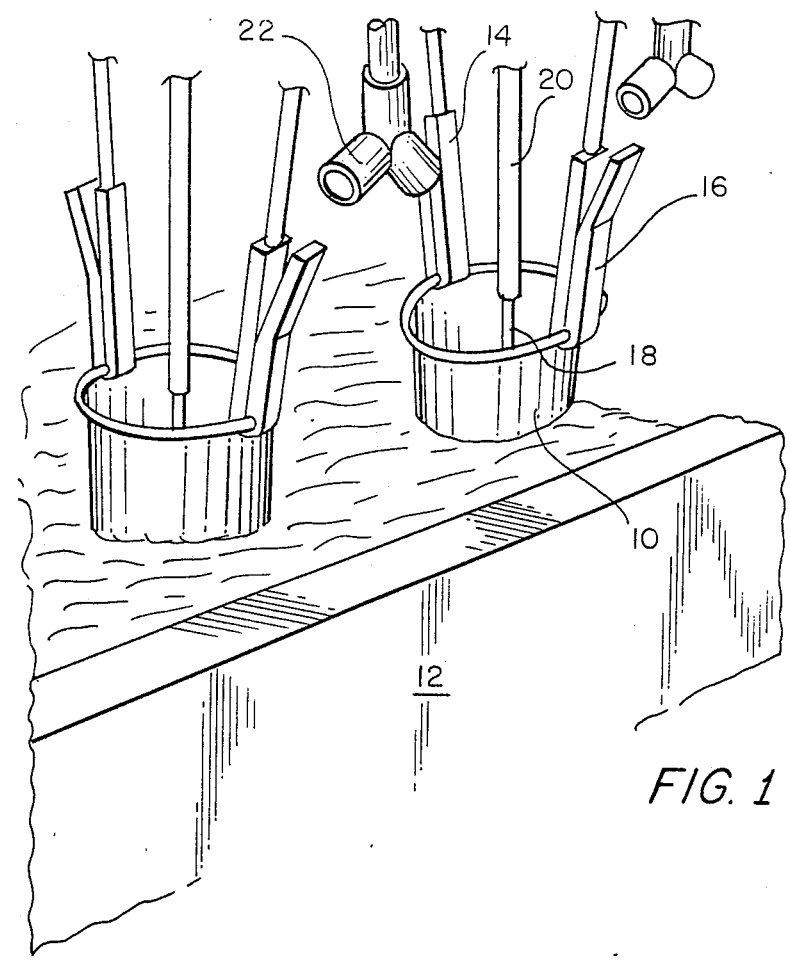
FIG. 1 is a fragmentary perspective, showing a plurality of water filled gloves held by pairs of clamps, each glove having a test electrode extending therein, while the gloves are immersed in a water test tank.

In FIG. 1, pairs of individual gloves 10 are illustrated as suspended from a glove rack by means of individual clips 14, 16 such that the interior of the gloves being tested may be filled with water and a test electrode 18 extended therein. Test electrode 18 may include an outer insulating cover 20 such that only the four inch tip of the electrode is exposed to water within individual glove 10. The gloves are shown as they are immersed into a water test tank 12 prior to high voltage testing.

In FIG. 2, the glove test apparatus is indicated as comprising housing 24 defining a glove filling station 26, a glove testing station 24 and a glove unloading station 30.

In the glove filling station 26, there is supported a water filling tank 32 with individual water fill drops or nozzles 34 extensible downwardly from the tank into individual gloves being tested. A two rail plastic glove rail track 36, 38 extends through the top of the filling, testing and unloading stations, so as to movably support glove holding rack 66.

Figure 4:
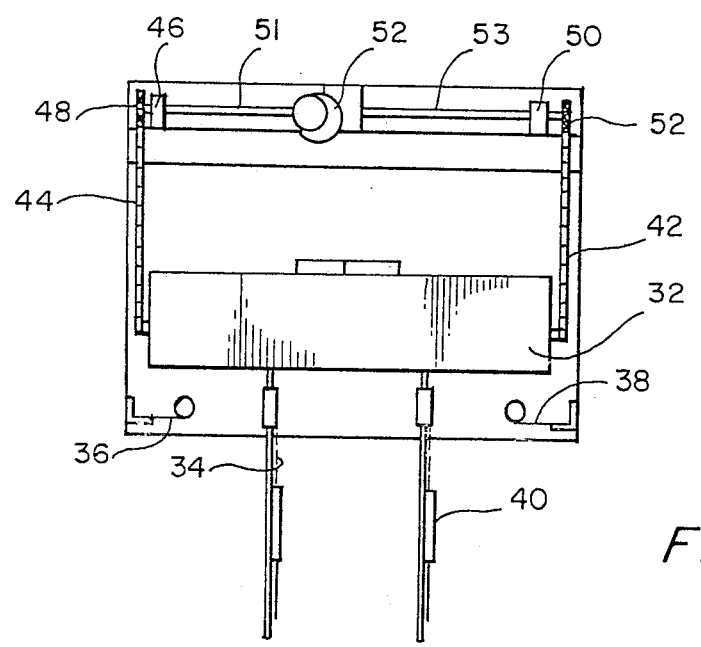
FIG. 4 is an end elevation of the glove-filling water tank and the individual water fill "drops" or nozzles.

As illustrated in FIG. 4, the individual water fill drop nozzles 34 may have electric water control units 40 attached thereto for adjusting the level of fill. Water fill tank 32 is raised and lowered to fill the gloves with the required water level. For this purpose, a roller chain mechanism 42, 44 engages sprockets 48 and 50. A drive means 52 is employed to drive shafts 51, 53 supported in pillow blocks 46, 50.

The water filling station includes control panel 27 and control lights 54 to control and monitor filling of the water level in individual gloves.

Figure 5:
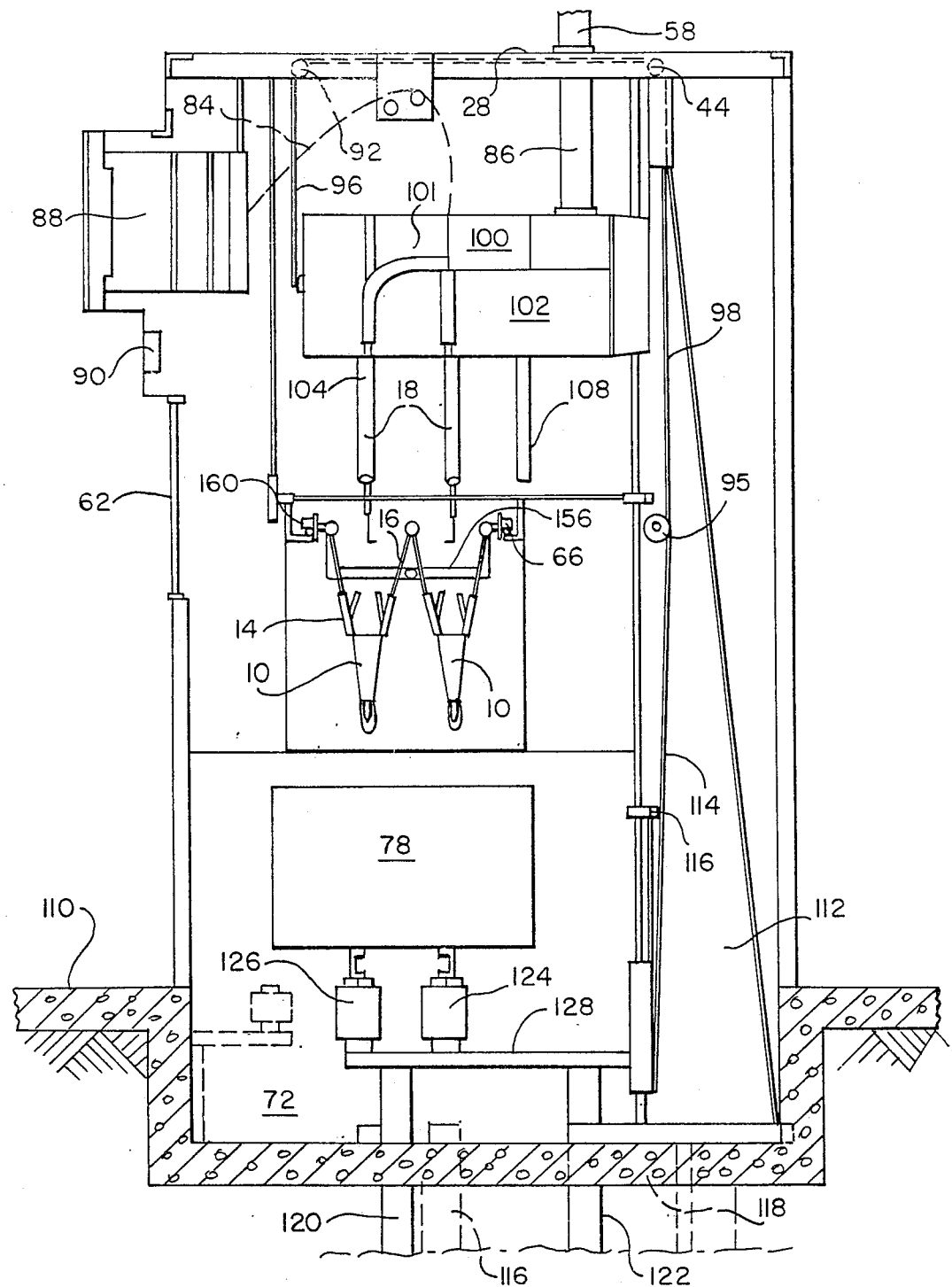
FIG. 5 is an end elevation of the water test tank prior to its being elevated within the testing station to immerse individual gloves clamped onto the glove-holding rack.

In the glove testing station illustrated in FIG. 5, air intake duct 56 and discharge duct 58 are maintained in contact with the air manifold 101, including air supply tank 100 and air return tank 102. Plastic tubing 104, 106 may extend coaxially with the test electrodes 18 such that air is discharged around individual electrodes 18 and a series of air suction tubes 108 may be employed to return the air through the air return tank 102 and air discharge duct 58 to a fan (not illustrated) on the roof of the housing.

As illustrated in FIG. 3, testing area 28 may include sliding glass windows 60, 62 as well as control panel 64, so that the test operator may view the raising of the water test tank 78 to immerse individual gloves 10 and view individual glove test results. Also, as illustrated in FIG. 3, a PVC drain line 80 may interconnect the water filling, testing and unloading areas.

Figure 6:
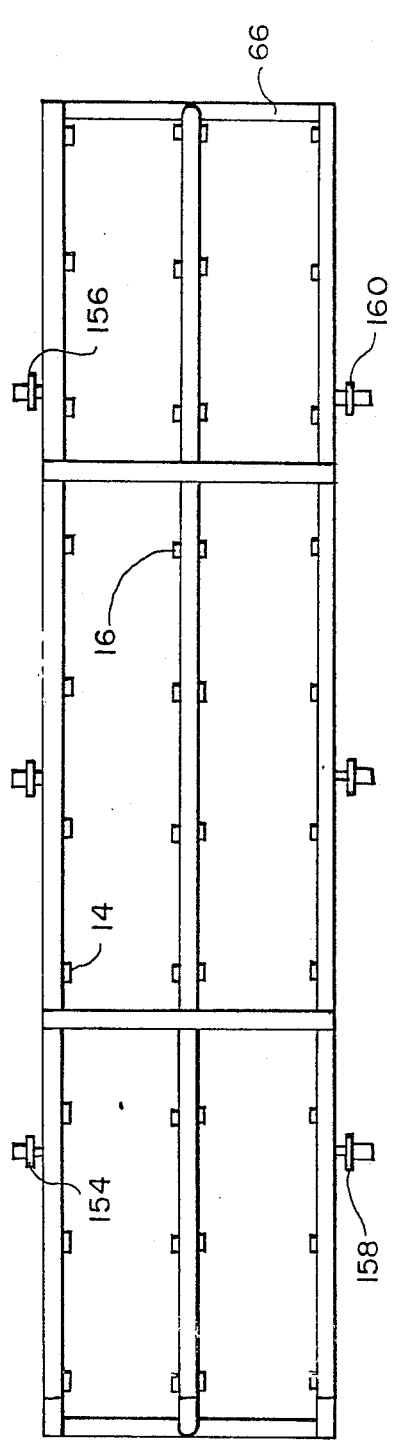
FIG. 6 is a top plan of the glove-holding rack with a plurality of laterally extending rollers for engaging the longitudinally extending track.

In FIGS. 5 and 6, the rubber glove holding rack 66 is illustrated as capable of holding ten pairs of gloves by means of pairs of clips 14, 16. Rack 66 includes laterally extending F/G rollers 154, 156, 158 and 160, engageable with the glove rack track 36, 38. A suitable drive means (not illustrated) may be employed to transport rack 66 through the housing.

As illustrated in FIG. 5, the individual gloves extending beneath rack 66 are thusly suspended within the test station above water test tank 78. Test tank 78 is adjustably suspended upon tank support members 124, 126, affixed to tank support platform 128. A pit area 72 is defined beneath the test station for accommodation of the individual screw jacks 120, 121, 122, 123, the transformer pit 116 and power transformer 118.

Figure 8:
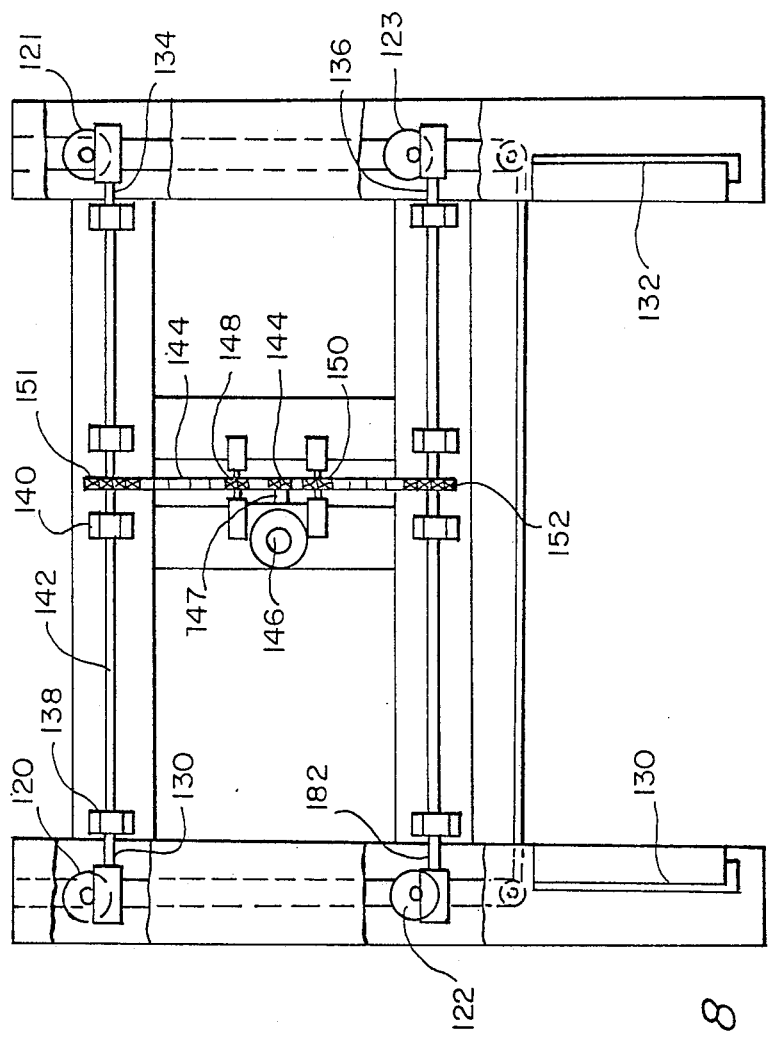
FIG. 8 is a top plan view of the screw jack support structure for elevating the water test tank above the pit area within the testing station.
Figure 7:
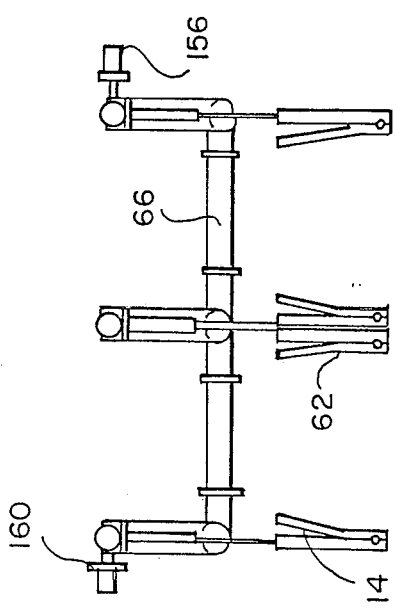
FIG. 7 is an end elevation of the glove-holding rack, showing the downwardly extending individual rubber glove holding clips.

As illustrated in FIG. 8, the screw jack elevating unit includes adjustable shafts 142, mounted in pillow blocks 138, 140 and extending to screw jack coupling bodies 130, 132, 134, 136.

Sprockets 148, 150, 151 and 152 are employed to support roller chain 144 in turn driven by electric gear motor 146 having drive shaft 147.

As electric gear motor 146 is activated, the jack staffs 120, 121, 122 and 123 are elevated to raise water test tank 78 and thereby immerse gloves 10 for test purposes, as illustrated in FIG. 1. As testing is completed, gloves 10 may be dropped in rinse water held within unloading station 30 before going to drying station 68, having a vent duct 70. A rinse water pan 70 supported in the lower portion of unloading station 30.

Figure 9:
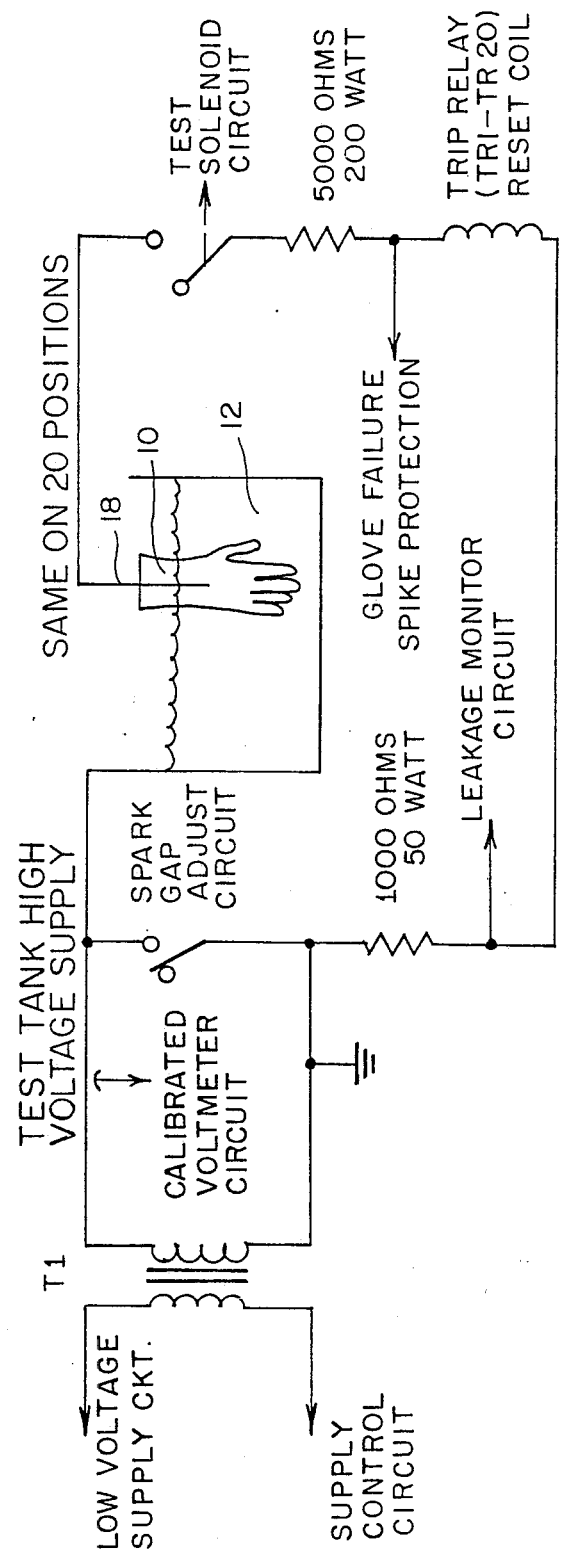
FIG. 9 is a schematic diagram of a high voltage glove test circuit.

A proposed high voltage test circuit is schematically illustrated in FIG. 9 as including a low voltage supply circuit and transformer providing a high voltage supply for water test tank 78, as well as a leakage monitor test circuit including individual electrodes 18 extensible into the water filled gloves 10. As will be apparent, the system and test circuit provide for the removal of any individual glove which has failed testing, while continuing dielectric testing of the remaining gloves supported in the test tank. The system is unique in this capability. Also, since unpressurized water is used to fill the gloves, air bubbles and air pockets both inside and outside of the gloves are virtually eliminated.

I claim:

1. Apparatus for dielectric testing of gloves comprising:
   (a) an elongated housing including a glove loading station, a glove testing station and a glove unloading station;
   (b) a longitudinal track supported in the top of said housing and extending through the stations;
   (c) a glove holding rack engaging said track and having a plurality of clamps, engageable with the open ends of gloves being tested, so as to suspend said gloves vertically within the housing;
   (d) a glove-filling water tank adjustably supported above said glove rack within said glove loading station and, including individual water fill drops extensible from said tank into individual gloves;
   (e) a vertically adjustable water test tank supported in said test station beneath said glove holding rack, so as to be elevated towards said glove rack and immerse gloves being clamped thereon; and
   (f) a high voltage test circuit interconnecting an electrical power supply, said water test tank and a plurality of individual electrodes supported in the top of said testing station and extensible into the open ends of gloves being tested.

2. Apparatus for dielectric testing of gloves as in claim 1, said glove-filling water tank being adjustably supported within said housing upon a chain and sprocket system having:
   (a) sprockets supported upon horizontal shafts mounted at the top ends of said housing;
   (b) roller chains extending from the sides of said water tank and over said sprockets; and
   (c) drive means engaging said horizontal shafts.

3. Apparatus for dielectric testing of gloves as in claim 2, said vertically adjustable water test being supported upon jack staffs extending from a base into said housing.

4. Apparatus for dielectric testing of gloves as in claim 3, said individual test electrodes in said glove testing circuit including an insulating cover, such that only the lower portion of said electrodes contacts water contained within said gloves being tested.

5. Apparatus for dielectric testing of gloves as in claim 4, including an air intake and air discharge system supported within the top of said testing station.

6. Apparatus for dielectric testing of gloves as in claim 5, said air intake and air discharge system further including:
   (a) a vertically adjustable air manifold supported in said test station tops and having:
   (b) individual air discharge pipes extending from said air manifold and encircling said individual test electrodes, and
   (c) a plurality of air return pipes extending from the test area to the outside of said housing.

7. Apparatus for dielectric testing of gloves as in claim 6, said water test tank including a power train, having:
   (a) a horizontal drive shaft connected to each said jack shaft by pillow block and sprocket means;
   (b) a sprocket and roller chain drive system engaging said drive shafts; and
   (c) a gear motor, driving said sprocket and roller chain drive system, so as to drive said shafts and adjustably raise and lower said screw jacks.

8. Apparatus for dielectric testing of gloves as in claim 7, said high voltage test circuit, including an independent test solenoid circuit connected to each test electrode, such that individual glove failure during testing does not impede continuing testing of the remaining gloves.

9. Apparatus for dielectric testing of water proof containers comprising:
   (a) an elongated housing including a container loading station, a container testing station and a container unloading station;
   (b) a longitudinal track supported in the top of said housing and extending through the stations;
   (c) a container holding rack engaging said track and having a plurality of clamps, engageable with the open ends of containers being tested, so as to suspend said containers vertically within the housing;
   (d) a container-filling water tank adjustably supported above said container rack within said container loading station and, including individual water fill drops extensible from said tank into individual containers;
   (e) a vericaly adjustable water test tank supported in said test station beneath said container holding rack, so as to be elevated towards said rack and immerse containers being clamped thereon; and
   (f) a high voltage test circuit interconnecting an electrical power supply, said water test tank and a plurality of individual electrodes supported in the top of said testing station and extensible into the open ends of containers being tested.

* * * * *